(12) United States Patent
Hemmett et al.

(10) Patent No.: US 7,849,429 B2
(45) Date of Patent: Dec. 7, 2010

(54) METHODS FOR CONSERVING MEMORY IN STATISTICAL STATIC TIMING ANALYSIS

(75) Inventors: Jeffrey G. Hemmett, St. George, VT (US); Natesan Venkateswaran, Poughkeepsie, NY (US); Chandramouli Visweswariah, Croton-on-Hudson, NY (US); Vladimir Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 12/053,887

(22) Filed: Mar. 24, 2008

(65) Prior Publication Data

US 2009/0241078 A1    Sep. 24, 2009

(51) Int. Cl.
G06F 17/50    (2006.01)
G06F 9/45    (2006.01)

(52) U.S. Cl. .............................................. 716/6; 716/4
(58) Field of Classification Search ............... 716/6, 716/4
See application file for complete search history.

(56) References Cited

U.S. PATENT DOCUMENTS

| | | | |
|---|---|---|---|
| 6,237,127 B1 * | 5/2001 | Craven et al. .................. | 716/6 |
| 6,321,362 B1 | 11/2001 | Conn et al. | |
| 6,678,644 B1 * | 1/2004 | Segal ........................... | 703/15 |
| 7,010,763 B2 * | 3/2006 | Hathaway et al. .............. | 716/2 |
| 7,424,694 B2 * | 9/2008 | Ikeda ........................... | 716/6 |

(Continued)

OTHER PUBLICATIONS

Chopra, et al., "A New Statistical Max Operation for Propagating Skewness in Statistical Timing Analysis", Proceedings of the 2006 IEEE/ACM International Conference on Computer-Aided Design Table of Contents, San Jose, CA. Session: Statistical Timing Analysis Table of Contents, pp. 237-243.

(Continued)

Primary Examiner—Thuan Do
Assistant Examiner—Magid Y Dimyan
(74) Attorney, Agent, or Firm—Wood, Herron & Evans, LLP

(57) ABSTRACT

A method is provided for memory conservation in statistical static timing analysis. A timing graph is created with a timing run in a statistical static timing analysis program. A plurality of nodes in the timing graph that are candidates for a partial store and constraint points are identified. Timing data is persistently stored at constraint points. The persistent timing data is retrieved from the constraint points and used to calculate intermediate timing data at the plurality of nodes during timing analysis.

7 Claims, 2 Drawing Sheets

U.S. PATENT DOCUMENTS

| | | | |
|---|---|---|---|
| 2001/0010090 A1* | 7/2001 | Boyle et al. | 716/2 |
| 2003/0229871 A1* | 12/2003 | Nakae et al. | 716/6 |
| 2005/0065765 A1 | 3/2005 | Visweswariah | |
| 2005/0066296 A1 | 3/2005 | Visweswariah | |
| 2005/0066298 A1 | 3/2005 | Visweswariah | |
| 2006/0085775 A1 | 4/2006 | Chang et al. | |
| 2007/0234256 A1 | 10/2007 | Chang et al. | |
| 2008/0072198 A1* | 3/2008 | Celik et al. | 716/6 |
| 2009/0055785 A1* | 2/2009 | Zhang et al. | 716/6 |
| 2009/0327985 A1* | 12/2009 | Chen et al. | 716/6 |

OTHER PUBLICATIONS

Jess, et al., "Statistical Timing for Parametric Yield Prediction of Digital Integrated Circuits", Design Automation Conference, Jun. 2003, Anaheim, CA, pp. 932-937.

Le, et al. "STAC: Statistical Timing Analysis with Correlation", Proceedings of the 41st Design Automation Conference 2004, pp. 343-348.

Visweswariah, et al., "First-Order Incremental Block-Based Statistical Timing Analysis", Proceedings of the 41st Design Automation Conference, Jun. 2004, San Diego, CA. pp. 331-336.

* cited by examiner

METHODS FOR CONSERVING MEMORY IN STATISTICAL STATIC TIMING ANALYSIS

FIELD OF THE INVENTION

The present invention relates generally to integrated circuit design, and more particularly, to a method for improving integrated circuit design performance by analyzing integrated circuit timing based on statistical static timing analysis.

BACKGROUND OF THE INVENTION

Conventional static timing analysis (STA) has been a stock analysis algorithm for the design of digital circuits over the last thirty years. However, in recent years, the increased variation in semiconductor devices and interconnect has introduced a number of issues that cannot be handled by traditional (deterministic) STA. This has led to considerable research into statistical static timing analysis, which replaces the normal deterministic timing of gates and interconnects with probability distributions, and gives a distribution of possible circuit outcomes rather than a single outcome.

In statistical static timing analysis (SSTA), timing quantities are propagated as statistical distributions where traditional deterministic STA timing propagates only single valued deterministic data. The propagated timing quantities include arrival times (AT), required arrival times (RAT), and slews, along with other timing related quantities such as guard times, adjusts, asserts, etc. SSTA and STA operate on a timing graph comprised of points at which signal transitions can occur, which may be referred to as timing points or nodes, and edges that connect incident nodes. Timing values are computed for the timing graph at each node based upon arrival times (ATs), which define the time (or time distribution) at which a given signal arrives at a timing point, and required arrival times (RATs), which define the time (or time distribution) at which the signal is required to get to the timing point, in order to meet the timing requirements. These ATs and RATs are used to compute slacks at nodes (RAT minus AT for late mode and AT minus RAT for early mode). A negative slack for either a late mode test slack or an early mode slack indicates a timing constraint violation.

Each STA timing run considers a single corner of a process space, which represents a set of input values for parameters that may include temperature of the circuit, input voltage, and various manufacturing parameters of an integrated circuit. In order to evaluate the impact that a given parameter will have on timing, multiple STA timing runs must be executed with parameters that affect timing set at several maximum and minimum corners, such as high and low temperature, high and low voltages, and various processing conditions. For example, STA timing runs may compare a corner having high input voltage, low operating temperature, and the best manufacturing parameters with a corner with a low input voltage, high operating temperature, and the worst manufacturing parameters. As a check of the performance of the integrated circuit design, many or all of the corners may be run and the integrated circuit design adjusted until all of the corners pass the timing tests. These results reflect the extreme performance bounds of the integrated circuit and require multiple timing runs.

A significant benefit of SSTA is that, because the timing quantities are propagated as statistical distributions, SSTA provides coverage over the entire process space. For example, a single SSTA timing run may suffice in instances where multiple STA timing runs would traditionally be required. Additionally, a test that passes in a single corner under STA may actually fail in one or more other corners, which would not be discovered unless multiple STA timing runs are performed. Therefore, multiple STA runs would be required to close timing, and even then it may be highly unlikely that the full process space would be covered, as this would be prohibitively expensive. For example, if there were only two corners per parameter, then 2N corners would have to be analyzed by STA timing runs to achieve the same full coverage of the process space boundary provided by a single SSTA timing run.

Statistical methods may also provide intrinsic means of pessimism reduction as a result of the statistical techniques inherent in the method. For example, the propagation of a known independently random term allows for the RSSing of random data between each propagation state. RSSing is taking the square root of the sum of the squares of two quantities, in place of straight summation, resulting in a significantly reduced final product as compared to summation. This technique may be used to account for the conditional probabilities between the data being processed as it would be very unlikely that two uncorrelated variables would both simultaneously occupy their worst case locations. Other pessimism relief may occur when sampling the final distributions, as additional RSSing may occur between terms during projection from a distribution to some example sample value.

Finally, information regarding the probability of particular failure modes may be obtained in SSTA, as opposed to STA, which is binary indicating only a pass/fail condition. SSTA may allow for very low probability fails to be ignored while also allowing for a more aggressive clipping of the statistical tails when used with at speed test. Peripherally, the SSTA results may provide indicators of how the design and/or process may be improved or made more robust by indicating individual sensitivities to the various sources of variation, allowing for more robust designs and improved yields. The result is that SSTA methods can reduce pessimism, effectively improving the performance of any technology node, and this benefit only increases as technology marches forward and variability increases. Additionally SSTA may simultaneously provide a means to tune processes and designs for increase robustness and yield.

Benefits of SSTA, however, do come with associated costs, and mitigation of these costs goes a long way towards making SSTA a practical approach. One of the more significant costs is related to a significant increase in memory requirements. In every location where STA would store a single timing value (e.g., an arrival time), SSTA must store a complete statistical description of the same timing quantity. The statistical description may contain at least N+3 terms, where N is the number of sources of variation and the additional terms include a distribution mean, an independently random term, and a term for systematic variation. Currently the number of sources of variation may exceed ten, and this will likely grow with advances in technology. Also, the number of sources of variation can increase appreciably when spatial variation is considered, as in the case where the effects of all surrounding topology is also considered at a given timing point. Therefore, the memory required to store a single timing quantity in SSTA may often be a factor of ten times or more than the memory required in STA. This memory requirement may pose a significant obstacle to SSTA analysis as contemporary STA is already pushing the storage limits of typical available memory for large designs.

What is needed therefore is a method to implement SSTA for timing analysis that overcomes the need for large memory requirements and other deficiencies of conventional approaches to SSTA.

SUMMARY OF THE INVENTION

A method is provided for memory conservation in statistical static timing analysis. A timing graph is created with a timing run in a statistical static timing analysis program. A plurality of nodes in the timing graph is identified that are candidates for a partial store. Constraint points are also identified. Timing data is persistently stored at the constraint points. This timing data may then be retrieved from the constraint points and used to calculate intermediate timing data at the plurality of nodes using the retrieved persistent timing data during timing analysis.

The plurality of nodes may be identified by traversing a timing graph to identify nodes for the partial store a-priori and flagging the identified nodes. Alternately, the plurality of nodes may be identified by dynamically identifying nodes for the partial store during timing analysis.

Constraint points in some embodiments include test points. The constraint points are identified to balance re-calculation costs with memory savings. The partial store may include restricting storing of timing data to tightness probabilities or other related data useful in timing quantity reconstruction for some embodiments. The timing data generally includes statistical distributions of arrival times (AT), statistical distributions of required arrival times (RAT), statistical distributions of slews, tightness probabilities, and combinations thereof. The timing data for SSTA analysis also includes statistical variations.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Embodiments of the invention persistently store data for selected points in the timing graph and, then, recalculate missing data as required. For example, one may choose to only persistently store 'test point data'. Test point data is defined as points where one or more timing test exists, and forms a basis for timing validation. All other timing points may contain intermediate propagated data, which only indirectly contributes to timing validation via propagation to the test points. In traditional STA, this may only provide marginal benefit; however, in SSTA, the significant increase in data propagated results may translate to significant memory savings.

Figure 1:
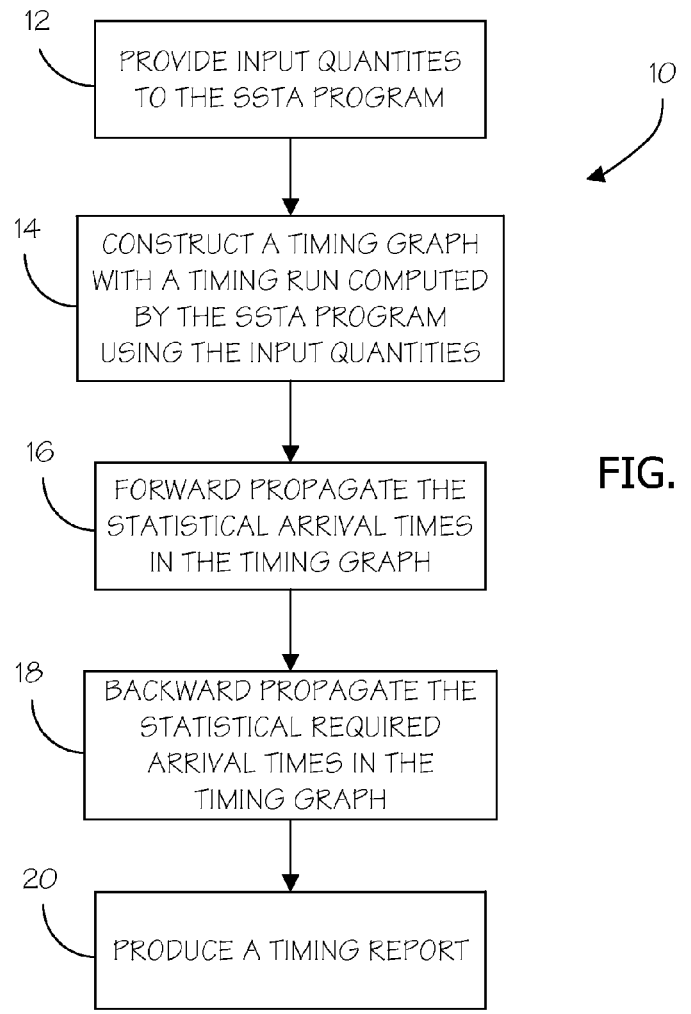
FIG. 1 is a flow chart of a method of conducting statistical static timing analysis of an integrated circuit in accordance with an embodiment of the invention.

With reference to FIG. 1, a process flow 10 for a typical SSTA program is shown. In block 12, inputs are supplied to the SSTA program. Specifically, the SSTA program reads and flattens a netlist representing the structure of the circuit to be analyzed, a set of timing assertions, a set of parameterized delay models governing the parameters that operate as sources of variation, parameter sensitivities relating the delay to each individual parameter, and statistical information describing the parameters. The timing assertions, each of which can be either deterministic or probabilistic, may include arrival times at the primary inputs, required arrival times at the primary outputs, information about the phases of the clock, and details of external loads that are driven by the primary outputs. The parameterized delay models permit the SSTA program to determine the delay of a gate or wire as a function not only of traditional delay-model variables (like input slew or rise/fall time, and output load) but also as a function of the sources of variation. Each parameter is assigned a probabilistic distribution, such as a normal or Gaussian distribution, characterized by a mean value and standard deviation, and any correlations between the parameters are specified.

In block 14, the SSTA program constructs a timing graph containing nodes at which signal transitions can occur and edges connecting incident nodes. In the timing graph, each node represents a node or signal of the circuit and each edge represents a delay in the circuit incurred when a logical transition (from low to high or from high to low) is transmitted through a circuit component, such as a gate or wire. Timing values computed for each node include arrival times (ATs) and required arrival times (RATs). Arrival times are typically stored on the nodes of the timing graph and delays of individual gates and wires are typically stored on the edges of the timing graph.

An AT in late mode is the earliest time at which the corresponding signal is guaranteed to be stable at its correct logical value after the signal has traversed any of the possible paths of the integrated circuit. An AT in early mode is the earliest time at which the corresponding signal can change from its stable logical value during the previous clock cycle. The output of the node cannot change earlier than the early mode AT. Sequential elements and dynamic circuits in the timing graph are represented by an edge, which is an indication to the timing program that a timing test must be performed between two nodes of the timing graph to ensure correct timing operation of the circuit. A RAT in late mode indicates the latest time within the clock period of a given clock phase that a signal transition may occur at the node without violating a timing constraint. A RAT in early mode indicates the earliest time within the clock period of a given clock phase that a signal transition may occur at the node without violating a timing constraint. Timing analysis uses a difference between the ATs and RATs to compute slacks at the nodes (RAT minus AT for late mode and AT minus RAT for early mode), which are defined thus so that a negative slack value will always indicate a timing constraint violation.

Block-based reporting of the slack distribution propagates one probability distribution from each stage to the next stage and, so on until it reaches the node using a statistical maximum operation for early mode arrival times (setup) or a statistical minimum operation for late mode arrival times (hold). The resulting AT distribution is an accurate statistical approximation of the actual AT distribution for all edges fanning into a given node.

In block 16, probabilistic distributions representing early mode ATs and late mode ATs at the test points are statistically forward propagated downstream in the timing graph. When multiple ATs or RATs are propagated along different edges to a node in the timing graph constituting a test point, the AT or RAT at the node is computed as the statistical maximum (for late mode ATs and early mode RATs) or the statistical minimum (for early mode ATs or late mode RATs) of the incoming edge values. The early mode AT at a node is determined from a statistical minimum of the distributions propagated along the incident edges. The late mode AT at a node is determined from a statistical maximum of the distributions propagated along the incident edges. Arrival tightness probabilities are determined that reflect the probabilities that the arrival time at a node is determined by each of the individual edges.

This forward propagation process is repeated until the probabilistic distributions representing early mode ATs and late mode ATs, as well as the slacks of the edges, have been determined at all test points in the timing graph. As part of this process, a statistical worst slack is determined for the edges fanning into each of the test points in the timing graph.

In block 18 and after the conclusion of forward propagation, probabilistic distributions representing RATs are backward propagated starting at each test point through the timing graph. Delays are subtracted from RATs in backward propagation as timing progresses from the primary outputs back to the primary inputs. In contrast to forward propagation, late mode analysis in backward propagation uses the statistical minimum operation and early mode analysis in backward propagation relies on the statistical maximum operation. The required arrival tightness probability of an edge of the timing graph is defined as the probability that the RAT of the source node of the edge is determined by that edge. Required arrival tightness probabilities are determined in much the same way as arrival tightness probabilities during the forward propagation and applied in much the same way to express required arrival times in the standard manner before propagating further. Otherwise, backward propagation is conducted by the SSTA program in a manner analogous to forward propagation.

Figure 2:
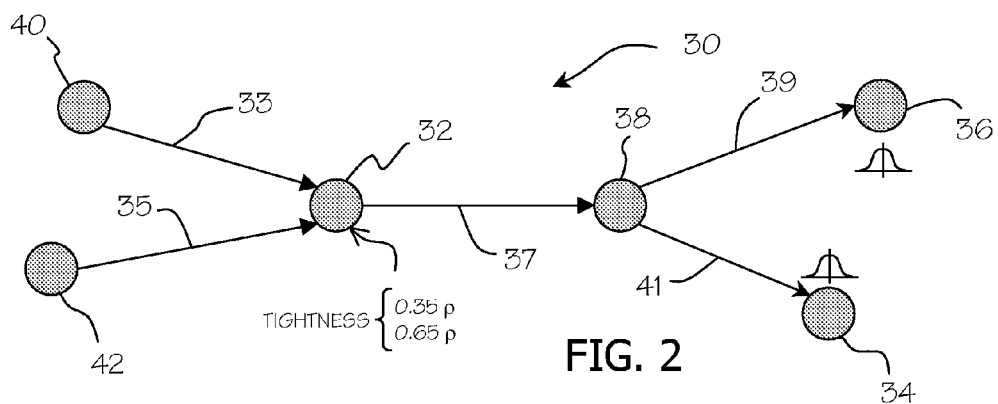
FIG. 2 is a diagrammatic view showing a portion of a timing graph having data stored at various nodes.

FIG. 2 illustrates a portion of an exemplary timing graph 30 that includes nodes 32, 34, 36, 38, 40, 420 and edges 33, 35, 37, 39, and 41. In this portion of the timing graph 30, a full set of data in the form of various statistical distributions and tightness probabilities may be persistently stored (full store) at nodes 34 and 36. Nodes 34 and 36 may be test points on the timing graph 310. Intermediate nodes 32, 38, 40, and 42 may have their timing data calculated on the fly. Timing data may fully calculated at the intermediate nodes such as 38, 40, and 42, or a subset of the data (partial store) including, for example, tightness probabilities or other related data useful in timing quantity reconstruction may be stored at the intermediate nodes, such as node 32, to reduce the required re-calculation times.

Figure 3:
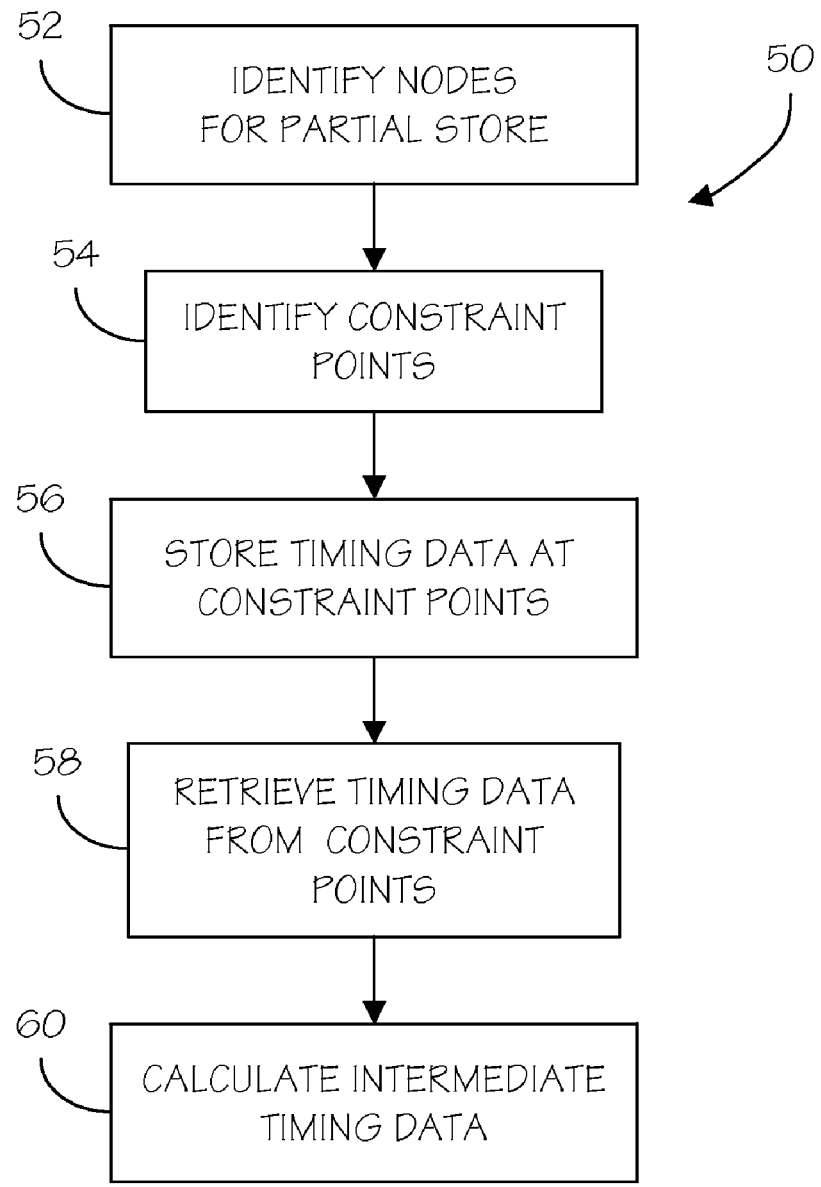
FIG. 3 is a flowchart showing a process for conserving memory in statistical static timing analysis in accordance with an embodiment the invention.

With additional reference now to the flow chart in FIG. 3, nodes are identified in the timing graph 30 that are candidates for a partial store in block 50. This may be performed either through a-priori graph traversal and flagging, or may be performed dynamically during the SSTA timing run. At present, those nodes flagged for partial store are nodes that are not test points, which may include nodes such as nodes 32 and 38 in FIG. 2.

Additionally, constraint points are identified in block 52. Fan-in and fan-out constraints may be based on a number of inputs and a number of outputs, and may be further considered to limit the re-calculation to only those gates with a minimal re-calculation cost. Statistical maximum and minimum operations may be performed on the propagated statistical distributions when the fan-in and fan-out are greater than unity. For some embodiments, these constraint points may be set to a partial store for only single input/single output nodes. Other embodiments may fully store data at the constraint points.

Furthermore, in instances where considered fan-in and fan-out values are greater than unity, the performance of the data reconstruction may be significantly improved by storing tightness probabilities at the intermediate points, such as point 32 in FIG. 2. During the statistical maximum and statistical minimum operations, the output is a linear combination of all of inputs, with the inputs scaled by their respective tightness probabilities. A tightness probability describes the probability that a given input will dominate the statistical maximum and statistical minimum operations. The sum of all tightness probabilities in the statistical maximum and statistical minimum operations is unity. For Gaussian or normal distributions fully characterized by a mean value and a standard deviation, the calculation of these probabilities can be analytic and fairly high performance. However, even in this instance, a performance benefit would be seen by caching the tightness probabilities as opposed to repeating the statistical maximum and statistical minimum operations. Other statistical distribution types also realize significant performance benefits. The memory overhead to store the tightness probabilities would be significantly less than the overhead to store the statistical representations.

As discussed above, data in the form of statistical distributions may be stored at the constraint points in block 54, such as points 34 and 36 in FIG. 2. Then, during the forward and backward propagation of timing quantities in the timing graph as described with regard to FIG. 1, timing data persistently stored at different nodes may then be retrieved in block 56. When upstream nodes (forward propagation) or downstream nodes (backward propagation) require data from partial store points or points with full data, an algorithm calculates the timing data on the fly in block 58. The algorithm recognizes that data is not stored, and dynamically reconstructs the data as needed, using stored tightness probabilities or other data where appropriate. The same may be done for any direct data queries by a user during reporting and other activities.

Note that by varying the constraints for fan-in and fan-out, and expanding the process to test points, a flexible trade off may be made between memory and runtime. By storing tightness probabilities, the cost of the additional runtime may also be minimized.

With continued reference to FIG. 1, in block 20, timing reports are produced by the SSTA program. The timing reports typically include arrival times, required arrival times, slacks, and slews at each node of the integrated circuit expressed as probability distributions. Specifically, the information in the timing reports may include, but is not limited to, mean value and variance for each timing quantity, a parameterized representation of the distribution of each timing quantity, a graphical representation of the distribution of each timing quantity, and a correlation report between these various timing quantities. Various automatic audits, such as checking for excessive parameter sensitivities, may be built into the timing report. Excessive parameter sensitivities typically must be reduced in order to improve the robustness of the circuit. The timing report also includes the proxy worst slack data, which is determined as outlined hereinabove.

Applicants hereby incorporate by reference herein the entire disclosure of U.S. Publication No. 2005/0065765, published Mar. 24, 2005 from Ser. No. 10/666353 filed Sep. 19, 2003 and entitled "System and Method for Statistical Timing Analysis of Digital Circuits", for additional description of the SSTA process.

While all of the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the applicant's general inventive concept.

What is claimed is:

1. A method for memory conservation during statistical static timing analysis, the method comprising:
   creating a timing graph with a timing run in a statistical static timing analysis program;
   identifying a plurality of nodes in the timing graph that are candidates for a partial store;
   identifying one or more of the nodes as constraint points;
   persistently storing timing data at constraint points;
   retrieving persistent timing data from the constraint points; and
   calculating intermediate timing data at the plurality of nodes using retrieved persistent timing data during timing analysis,
   wherein the timing data is selected from the group consisting of statistical distributions of arrival times (AT), statistical distributions of required arrival times (RAT), statistical distributions of slews, tightness probabilities, and combinations thereof.

2. The method of claim 1 wherein identifying the plurality of points comprises:
   traversing the timing graph to identify nodes for the partial store a-priori; and
   flagging the identified nodes.

3. The method of claim 1 wherein identifying the plurality of points comprises:
   dynamically identifying nodes for the partial store during the timing run.

4. The method of claim 1 wherein the constraint points are identified to balance re-calculation costs with memory savings.

5. The method of claim 1 wherein the partial store comprises:
   restricting storing of timing data to tightness probabilities or other related data useful in timing quantity reconstruction.

6. The method of claim 1 wherein the timing data comprises statistical variations.

7. The method of claim 1 wherein the constraint points include test points.

* * * * *